US006653259B2

(12) United States Patent
Koczor et al.

(10) Patent No.: US 6,653,259 B2
(45) Date of Patent: Nov. 25, 2003

(54) FABRICATION OF LARGE BULK HIGH TEMPERATURE SUPERCONDUCTING ARTICLES

(75) Inventors: Ronald J. Koczor, Owens Crossroads, AL (US); Robert A. Hiser, Huntsville, AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 186 days.

(21) Appl. No.: 10/028,295

(22) Filed: Dec. 20, 2001

(65) Prior Publication Data

US 2003/0119676 A1 Jun. 26, 2003

(51) Int. Cl.[7] ................... C04B 35/00; H01L 39/00; B08B 3/00
(52) U.S. Cl. ............... 505/100; 505/121; 505/125; 505/490; 505/725; 505/782; 264/109; 264/122; 252/519.13; 252/519.15
(58) Field of Search ............... 505/725, 782, 505/432, 490, 492, 500, 121, 125, 150, 230, 100; 264/109, 122; 252/579.13, 579.15

(56) References Cited

U.S. PATENT DOCUMENTS 5,525,586 A * 6/1996 Singh et al. ............... 505/490

FOREIGN PATENT DOCUMENTS

DE 4003542 A * 8/1991 ............ B28B/1/26

* cited by examiner

Primary Examiner—Yogendra N. Gupta
Assistant Examiner—Kallambella M Vijayakumar
(74) Attorney, Agent, or Firm—James J. McGroary

(57) ABSTRACT

A method of fabricating large bulk high temperature superconducting articles which comprises the steps of selecting predetermined sizes of crystalline superconducting materials and mixing these specific sizes of particles into a homogeneous mixture which is then poured into a die. The die is placed in a press and pressurized to predetermined pressure for a predetermined time and is heat treated in the furnace at predetermined temperatures for a predetermined time. The article is left in the furnace to soak at predetermined temperatures for a predetermined period of time and is oxygenated by an oxygen source during the soaking period.

6 Claims, 1 Drawing Sheet

FABRICATION OF LARGE BULK HIGH TEMPERATURE SUPERCONDUCTING ARTICLES

ORIGIN OF THE INVENTION

Figure 1:
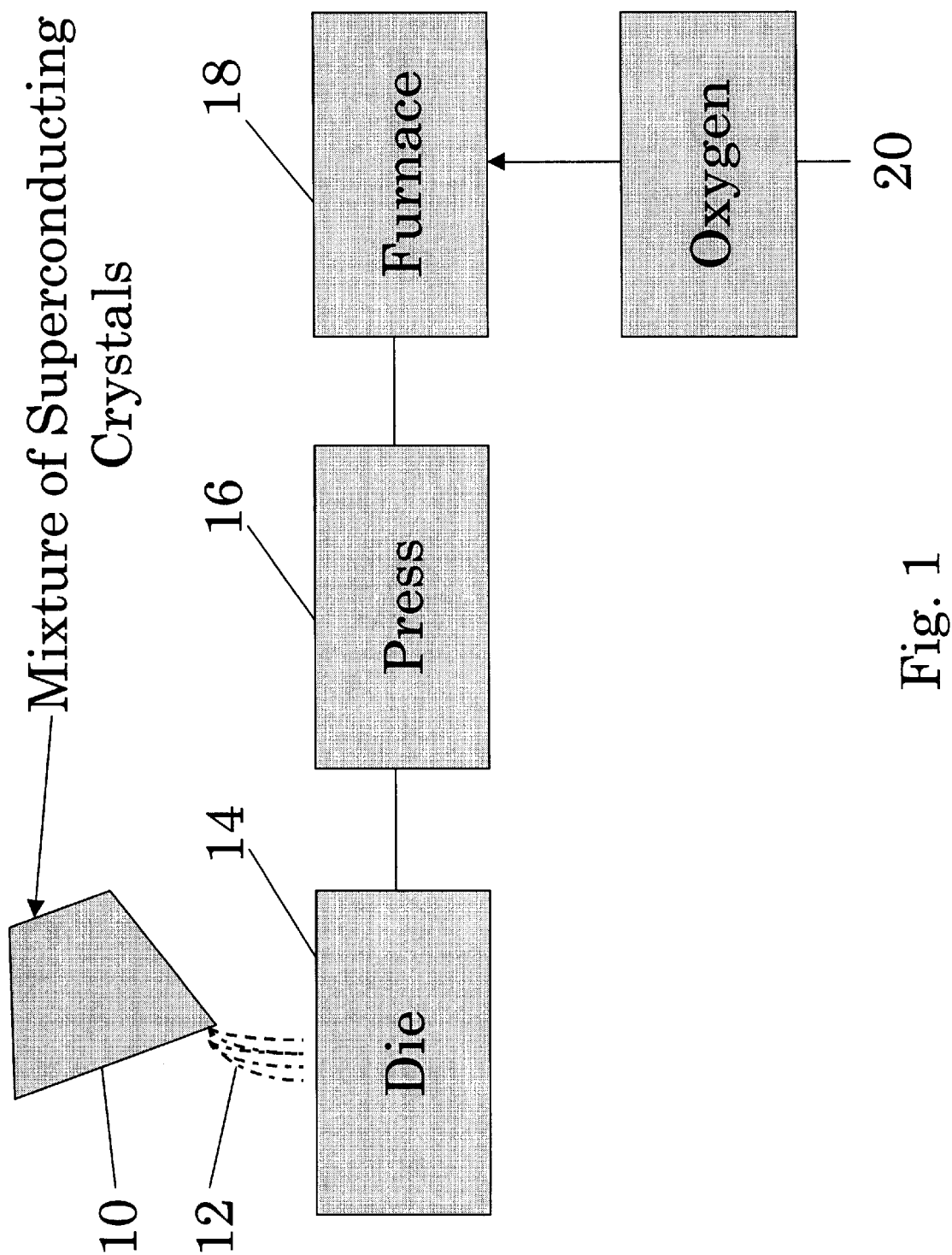

This invention was made with government support under purchase order no. H-27774D awarded by the National Aeronautics and Space Administration. The Government has certain rights in this invention.

FIELD OF THE INVENTION

The present invention relates generally to a method of fabrication of superconducting articles and more particularly to the fabrication of large bulk high temperature superconducting (HTS) articles.

BACKGROUND OF THE INVENTION

In 1992 a scientific paper was published suggesting that large high temperature superconductors of YBCO material might interact with the local gravity field when spun and exposed to certain electromagnetic fields. The effect required at least a 12 inch diameter annular disk in the experimental apparatus. Several such disks were created for this experiment in Moscow, Russia. But no details of the methods used to create the large disks were revealed. Smaller pieces of this material have been fabricated for years. But to the best of our knowledge, the present large disk is the first of this size. No patents or scientific literature have been found describing the present method of producing such large superconducting articles. We believe that the process used herein is the first to successfully fabricate such a disk.

The objective was to create large pieces of HTS to create a large annular disk of the material. Problems encountered and overcome included problems of creating the green (unfired) piece which did not break apart prior to firing. This material is fragile and does not hold together well, unless it is processed properly. Small pieces are relatively easy to fabricate; however, the internal stresses in a large piece have always resulted in cracks and structural failures in the green disk.

Once the green disk is successfully fabricated, it must be fired to create the final item. Firing has also been a problem with large pieces, since the thermal stresses caused by large temperature changes and gradients across the piece resulted in cracks and structural defects.

The present invention solves these problems with the result that large pieces of HTS can be successfully fabricated. The initial fabrication applies to a 12 inch diameter annular disk; however, the method can be extended to other shapes and sizes. Note that many patents exist which claim methods for formulating the chemical constituents of such ceramic superconductors. The methods described herein focuses on the physical conditioning of the materials rather than the chemical. The methods described herein can be used with most (if not all) of the chemical formulations used to manufacture HTS bulk items.

Accordingly it is an object of the present invention to provide a method of fabrication of large bulk high temperature superconducting articles.

SUMMARY OF THE INVENTION

In accordance with the present invention, the method of fabrication of large bulk high temperature superconducting articles includes the processes of material preparation, compression and heat treatment.

Material preparation includes the step of mixing superconducting powders such as YBCO or BISCCO into a homogeneous mixture. Particle sizes are chosen which are in a ratio of 1 to 3 to 10. That is, particle sizes of 50 microns, 150 microns and 500 microns in diameter.

In the compression step, the homogeneous mixture is then placed in a die which is then placed in a press and compressed at a predetermined pressure for a predetermined time.

In the heat treatment step, the green piece is removed from the die and then placed in a furnace and heated to sintering temperature and then allowed to soak at predetermined temperatures and then (while in the furnace) is oxygenated for a predetermined time before it is removed.

BRIEF DECRIPTION OF THE DRAWINGS

FIG. 1 is a block diagram illustrating the steps and apparatus for carrying out the method of the invention.

DESCRIPTION OF THE PREFERRED EMBODIMENTS

The process of the present invention utilizes a mixing container 10, superconducting crystals 12, a die 14, a press 16, a furnace 18, and an oxygen source 20 which are utilized in the manner set forth below.

This method described herein enables fabrication of large HTS items in a variety of shapes and sizes. The initial embodiment is designed to create annular disks approximately 12 inches in diameter. The material 12 used in the original fabrication is yttrium barium copper oxide, YBCO. However, the technique works equally well, for a variety of ceramic materials including barium strontium calcium copper oxide, BiSCCO.

The processes presently used to fabricate small items from these ceramic materials are adequate in sizes up to around 6 inches, or roughly 1 Kg of material. When extended to larger sizes, known physical processes within the piece create internal mechanical and thermal stresses which manifest themselves as cracks in the end item. The process disclosed herein also eliminates the need for the use of certain materials in material preparation which are often used in the present art as binders to hold the pressed (green) items intact prior to heat treatment. Finally, innovative use of a specific material called melt-textured superconducting material in a specific multi-sized particle mix reduces the heat treatment temperature and results in excellent superconductivity with reduced part shrinkage due to particulate densification.

The process defined in this innovation to produce large items of HTS consists of three steps or subprocesses. They are material preparation, compression and heat treatment.

Material Preparation

There are a variety of materials which can be used in this process to fabricate large YBCO superconductors. They can be YBCO superconducting powders, precursor raw materials, or superconducting crystals. Various elemental additives can be added to change and enhance the superconductivity of the end item, according to existing art, such as silver or platinum to increase mechanical strength and critical current, or iron to reduce critical current. An innovation of this process is the use of granular crystals of melt-textured YBCO in the material in any percentage up to 100%. Use of this material results in large superconducting domains and increased critical currents (a measure of superconductive performance). At the same time, the use of this material reduces part shrinkage (with attendant internal stresses) caused by particulate densification.

An additional innovation in this subprocess is the use of specific sizes of particles in the material to be compressed. A range of particle sizes is required to form a green piece which holds together prior to heat treating and does not crack from "springback" or release of internal stresses when compression pressure is released.

The particle sizes required are approximately in a ratio of 1 to 3 to 10. That is particles 12 of sizes 50 microns, 150 microns and 500 microns in diameter must be mixed as shown in a container 10 thoroughly in the material prior to loading into the die 14. This mix of particle sizes eliminates entrapped air and increases the binding forces within the green piece. The use of these multi-sized particles also eliminates the need for "binding" agents in the powder (which add adhesion of the particles to each other prior to heat treating).

Compression

Once the materials are properly mixed into a homogeneous mixture, the mixture is placed into a die 14 assembly for compression. The die is placed in a press 16 and pressed at about 14,200 pounds per square inch for 15 minutes. The die is specially designed for ease of loading of material and removal of the green disk. The pressure profile is defined as a slow, steady increase in pressure, taking roughly 5 minutes to reach 14,200 psi. It is important to maintain a steady rate of increase and not to take a "step and stop" profile which can result in internal fractures which then show up during thermal treating and ruin the part. Once the final pressure is attained, that pressure is held for about 15 minutes and then is quickly released. Time of release is unimportant, except that it must also be steady.

This process allows a variety of pressures to be used, ranging from about 10,000 to 16,000 psi. Pressures lower than about 10,000 psi result in green pieces with insufficient binding strength to hold together. Pressures higher than 16,000 psi result in an increased chance of "springback," which fractures the piece upon release from the die.

Heat Treatment

This subprocess consists of taking the green piece and heating it in a furnace 18 to sintering temperature and then oxygenating it from an oxygen source to increase its superconductivity. Several heat protocols and several final temperatures can be used in this subprocess, depending upon the final product desired.

For YBCO, the preferred heat treatment protocol is to heat the item slowly, taking about 12 hours to reach 930 C. (for a 12 inch diameter, ½ inch thick disk); this is followed by a 2 hour soak at 930 C. This is followed by a slow (approximately 60 C. per hour) decrease in temperature to between 500 C. and 350 C.; this is followed by a 7 day soak at the selected temperature to oxygenate the crystal structure of the YBCO. Note that thicker pieces require longer oxygenation while thinner pieces require less. The oxygenation temperature selected depends upon the material used in the disk and whether silver or other additives are included (and is known to the present art). Oxygenation is followed by a slow decrease in temperature (approximately 60 C. per hour) to room temperature when the treatment ends.

Note that these HTS materials (YBCO, BiSCCO, etc.) and their constituent components are highly reactive at temperatures approaching their melting points. Note also that higher temperatures normally result in higher densification of the end product and better superconductivity. Use of the melt-textured granules allows lower heat treating temperatures to be used with acceptable superconductivity. This lower temperature allows more materials to be used in the heat process to hold the HTS without chemical interaction. Materials such as silicon carbide, aluminum oxide, platinum, and magnesium oxide can be used at 930 C. while being unusable at much higher temperatures.

It is to be understood that the term "soak" as used herein means that the item is maintained at specific temperatures and is actually done in the furnace it is part of the oxygenating process. The sample remains in the furnace and is not removed until the complete process is terminated.

It is also to be understood that the die referred to herein is a free release type of die which allows the green piece to separate freely from the die. Such a die is known in the art.

What is claimed is:

1. A method of fabricating high temperature superconducting articles from crystalline superconducting material, comprising the steps of:

a) selecting specific particle sizes of superconducting crystals wherein the particles comprising a mixture of 50 micron, 150 micron and 500 micron sizes;

b) mixing said crystals into a homogeneous mixture;

c) pouring said mixture into a die;

d) pressurizing said mixture to a predetermined pressure for a predetermined time;

e) heating said mixture in a furnace to sintering temperature for a predetermined time;

f) oxygenating said mixture at various degrees of temperature while said mixture is still in said furnace.

2. The method as in claim 1 wherein said superconducting crystalline material is YBCO.

3. The method as in claim 2 wherein said pressurization of said material is about 14,200 psi and said predetermined time of pressurization is about 15 minutes.

4. The method of claim 3 wherein said pressured material is slowly heat treated by slowly raising the temperature.

5. The method of claim 4 wherein the heating profile includes the steps of taking about 12 hours to heat the furnace to 930 C., letting the material soak at said 930 C. for about 2 hours, slowly decreasing the heat of said furnace and therefore, said mixture of said superconducting crystals, said slow decrease being approximately 60 C. per hour, said decreased temperatures being between 500 C. and 350 C.;

flowing oxygen in said furnace, said oxygen flowing into said furnace for about seven days; and slowly decreasing temperature by about 60 C. per hour to room temperature.

6. The method of claim 1 wherein said superconducting material is BISCCO.

* * * * *